US008682520B2

United States Patent
Yamada et al.

(10) Patent No.: US 8,682,520 B2

(45) Date of Patent: Mar. 25, 2014

(54) CONTROLLER FOR VEHICLE

(75) Inventors: Kenji Yamada, Komaki (JP); Masayoshi Suhama, Toyota (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 13/701,888

(22) PCT Filed: Jul. 14, 2010

(86) PCT No.: PCT/JP2010/061868

§ 371 (c)(1), (2), (4) Date: Dec. 4, 2012

(87) PCT Pub. No.: WO2012/008022

PCT Pub. Date: Jan. 19, 2012

(65) Prior Publication Data

US 2013/0144477 A1 Jun. 6, 2013

(51) Int. Cl.
*G06F 17/00* (2006.01)

(52) U.S. Cl.
USPC .......... 701/22

(58) Field of Classification Search
USPC .......... 701/22
See application file for complete search history.

(56) References Cited

U.S. PATENT DOCUMENTS 7,005,860 B2 * 2/2006 Yamamoto et al. .......... 324/527
2008/0197855 A1 8/2008 Uchida
2009/0002903 A1 1/2009 Uchida
2009/0134881 A1 * 5/2009 Tachizaki .......... 324/551

FOREIGN PATENT DOCUMENTS

JP 2002-171606 A 6/2002
JP 2005-57918 A 3/2005
JP 2007-209158 A 8/2007
JP 2009-109278 A 5/2009
JP 2010-156661 A 7/2010
WO 2007/026603 A1 3/2007

OTHER PUBLICATIONS

International Search Report for PCT/JP2010/061868 dated Aug. 17, 2010 English Translation.

* cited by examiner

*Primary Examiner* — Mary Cheung
*Assistant Examiner* — Anne Mazzara
(74) *Attorney, Agent, or Firm* — Sughrue Mion, PLLC

(57) ABSTRACT

A controller for a vehicle including two inverters determines whether a detector currently performs an insulation determination process, and if not, the controller performs random control to randomly vary carrier frequencies corresponding to the two inverters, respectively. In contrast, if the insulation determination process is currently performed, the controller prohibits the random control and fixes the carrier frequencies at reference frequencies, respectively. The reference frequencies are previously set to have a difference Δfs larger than a predetermined value f1.

5 Claims, 7 Drawing Sheets

10#
20#
1
12
7
14A
14B
Q1
Q2
D1
D2
L1
CN0
13
VH
CN1
11
SR1
SR2
6
B
10
Ib
Vb
30
32
FILTER
Cd
Rd
Vw
33
DETERMINATION DEVICE
31
F L
BODY
S1,S2
5
Z1
BODY
Q3 Q5 Q7
D3 D5 D7
Q4 Q6 Q8
D4 D6 D8
15
16
17
S3A~S8A
S3B~S8B
24 24
iu1
iv1
iu2
iv2
M1
M2
V
U
W
25
θ1
θ2
Z2
Z3
BODY
BODY
F
L
40
iu1,iv1,iu2,iv2
Vb,Ib,VH
θ1,θ2
CONTROLLER
S1,S2
S3A~S8A
S3B~S8B

M1
M2
25
24
θ1
θ2
14A
14B
INVERTER
iw
iv
S3A～S8A
S3B～S8B
300
CARRIER CONTROL
CRA
CRB
220A
220
vw
→
dq
260A
260B
PWM
250A
250B
Vu
Vv
Vw
dq
→
uvw
Iq
Id
310
DETERMINATION
F
240A
240B
VOLTAGE COMMAND
Vd#
Vq#
ΔId
ΔIq
+
−
210A
210B
CURRENT COMMAND
Idcom
Iqcom
200A
200B
Trqcom1
Trqcom2

| | A1 | A2 | A3 | A4 |
|---|---|---|---|---|
| fas | fas1 | fas2 | fas3 | fas4 |
| fbs | fbs1 | fbs2 | fbs3 | fbs4 |

$\Delta fs = |fas - fbs| > f1$ $fas - (W1)/2 < fa < fas + (W1)/2$ $fbs - (W2)/2 < fb < fbs + (W2)/2$

FIG.11

| | A1 | A2 | A3 | A4 |
|---|---|---|---|---|
| fbs | fbs1 | fbs2 | fbs3 | fbs4 |

$fbs-(W2)/2 < fb < fbs+(W2)/2$

↓

$fa = fb + f0$

CONTROLLER FOR VEHICLE

CROSS REFERENCE TO RELATED APPLICATIONS

This application is a National Stage of International Application No. PCT/JP2010/061868 filed Jul. 14, 2010, the contents of which are incorporated herein by reference in their entirety.

TECHNICAL FIELD

The present invention relates to controlling a vehicle, and particularly to a technique employed to control a plurality of inverters through pulse width modulation (PWM).

BACKGROUND ART

Conventionally, a system which employs an inverter to control a motor for causing a vehicle to travel has been adopted. Generally, electric vehicles, hybrid vehicles, fuel cell vehicles and other similar electrically powered vehicles have their traveling motors outputting torque as controlled by an inverter. Typically, the motor outputs torque as controlled through PWM control. In PWM control, a carrier wave signal (a carrier signal) and a voltage command are compared in voltage and an inverter has a switching element switched on/off in accordance therewith to apply pulse width modulated voltage to the motor.

The switching operation in the PWM control results in the inverter causing noise. To address this disadvantage, for example Japanese Patent Laying-Open No. 2002-171606 (PTL 1) discloses switching an inverter's switching frequency randomly to reduce noise.

CITATION LIST

Patent Literature

PTL 1: Japanese Patent Laying-Open No. 2002-171606
PTL 2: WO2007/026603
PTL 3: Japanese Patent Laying-Open No. 2005-57918

SUMMARY OF INVENTION

Technical Problem

However, if a vehicle having a plurality of inverters has their switching frequencies with a difference smaller than a predetermined value, a detector that detects whether the vehicle's high voltage system including the inverters has insulation failure may misdetect insulation failure.

The present invention has been made in order to solve the foregoing disadvantage and contemplates preventing misdetection of insulation failure in a vehicle including a plurality of inverters while reducing noise therein.

Solution to Problem

The present invention provides a controller for a vehicle. The vehicle includes: a power supply; a plurality of motors; a plurality of inverters performing electric power conversion between the power supply and the plurality of motors; an insulating resistor for externally, electrically insulating an electric conduction path connecting the power supply, the plurality of motors, and the plurality of inverters; and a detector connected to the insulating resistor via the electric conduction path and performing a determination process to determine whether the insulating resistor is defective, based on how a determination signal varies in potential, to detect whether the insulating resistor is defective. The determination signal varies in potential as the insulating resistor has a reduced resistance value, and the determination signal also varies when the plurality of inverters have operating frequencies with a difference smaller than a predetermined value. The controller includes: a determination unit that determines whether the detector currently performs the determination process; and a control unit that controls the operating frequencies of the plurality of inverters in accordance with a result provided by the determination unit. When the determination process is currently not performed, the control unit performs random control to arbitrarily vary each of the operating frequencies of the plurality of inverters, whereas when the determination process is currently performed, the control unit performs limitative control to restrict the random control to allow the plurality of inverters to have the operating frequencies with limited variation to prevent the operating frequencies from having a difference smaller than the predetermined value.

Preferably, the limitative control prohibits the random control and fixes the operating frequencies of the plurality of inverters to have a difference larger than the predetermined value.

Preferably, when a synchronous state in which the operating frequencies of the plurality of inverters that should be controlled by the random control have a difference smaller than the predetermined value, is not established, the limitative control maintains performing the random control, whereas when the synchronous state is established, the limitative control shifts the operating frequencies of the plurality of inverters to have a difference larger than the predetermined value.

Preferably, the limitative control varies any one of the operating frequencies of the plurality of inverters arbitrarily, and employs the arbitrarily varied operating frequency as a reference to limitatively shift the other operating frequency/frequencies from each other by a value corresponding to the predetermined value and thus varies the other operating frequency/frequencies.

Preferably, the plurality of inverters are operated as controlled based on a result of comparing a plurality of carrier signals corresponding to the plurality of inverters, respectively, with a plurality of control commands corresponding to the plurality of inverters, respectively, and the control unit controls the plurality of carrier signals to control the operating frequencies of the plurality of inverters.

Advantageous Effects of Invention

The present invention can thus prevent misdetection of insulation failure in a vehicle including a plurality of inverters while reducing noise therein.

BRIEF DESCRIPTION OF DRAWINGS

FIG. 11 represents by way of example a technique used to set carrier frequencies fa and fb by the controller.

DESCRIPTION OF EMBODIMENTS

Hereinafter, the present invention in embodiment will be described in detail with reference to the drawings. In the figures, identical or corresponding components are identically denoted and will not be described repeatedly in principle.

Figure 1:
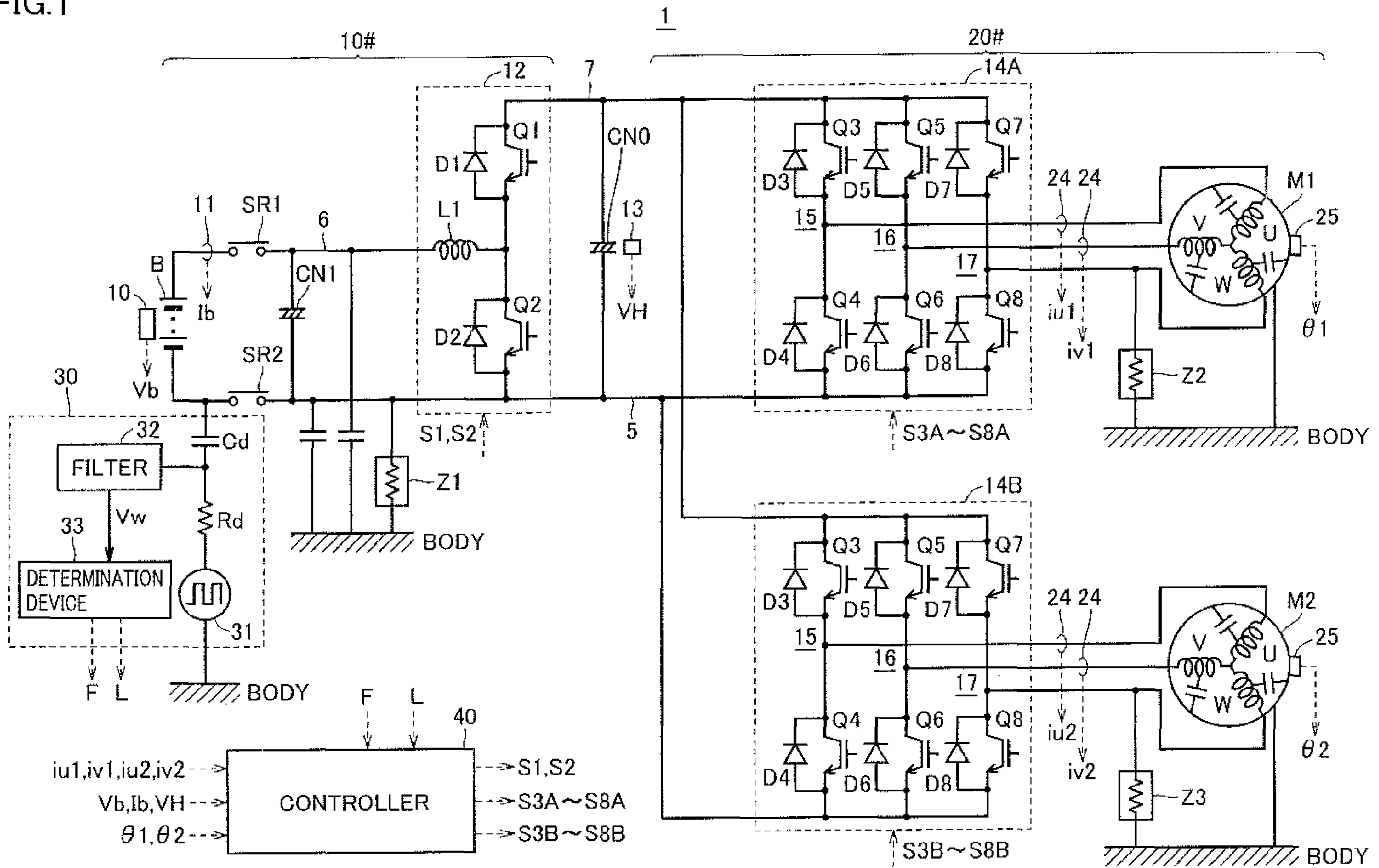
FIG. 1 generally shows a configuration of a motor drive control system.

FIG. 1 generally shows a configuration of a motor drive control system to which a controller according to an embodiment of the present invention is applied.

With reference to FIG. 1, a motor drive control system 1 comprises a direct current voltage generating unit 10#, a smoothing capacitor CN0, and a driving force generating unit 20#, and a controller 40.

Direct current voltage generating unit 10# includes a direct current power supply B, system relays SR1 and SR2, a smoothing capacitor CN1, and a converter 12.

Direct current power supply B is representatively a nickel hydride, lithium ion or similar rechargeable battery, an electric double layer capacitor or a similar power storage device, or the like. Direct current power supply B outputs direct current voltage Vb and direct current Ib, which are sensed by a voltage sensor 10 and a current sensor 11, respectively.

System relay SR1 is connected between a positive electrode terminal of direct current power supply B and a positive electrode line 6. System relay SR2 is connected between a negative electrode terminal of direct current power supply B and a negative electrode line 5. System relays SR1 and SR2 are turned on/off by a control signal output from controller 40.

Converter 12 includes a reactor L1, semiconductor switching elements for electric power (hereinafter simply referred to as "switching element/elements") Q1 and Q2, and diodes D1 and D2. Switching elements Q1 and Q2 are connected in series between a positive electrode line 7 and negative electrode line 5. For switching elements Q1 and Q2, antiparallel diodes D1 and D2 are disposed, respectively. Reactor L1 is connected between an intermediate point between switching elements Q1 and Q2 and positive electrode line 6.

Switching elements Q1 and Q2 are controlled by control signals S1 and S2, respectively, output from controller 40. When converter 12 operates, switching elements Q1 and Q2 are turned on periodically and complementarily (or alternately). In a voltage boosting operation, converter 12 receives direct current voltage Vb from direct current power supply B and boosts it to direct current voltage VH (hereinafter also referred to as "system voltage VH"). On the other hand, in a buck boosting operation, converter 12 buck-boosts direct current voltage VH to direct current voltage Vb.

Smoothing capacitor CN0 is connected between positive electrode line 7 and negative electrode line 5. Smoothing capacitor CN0 smoothes direct current voltage received from converter 12 and supplies the smoothed direct current voltage to inverters 14A and 14B. Voltage sensor 13 senses voltage across smoothing capacitor CN0, i.e., system voltage VH, and outputs the sensed value to controller 40.

Driving force generating unit 20# comprises inverters 14A and 14B, and motors M1 and M2.

Motors M1 and M2 are motors for example for generating torque for driving a driving wheel of an electrically powered vehicle (a hybrid vehicle, an electric vehicle, a fuel-cell vehicle, and a similar automobile that employs electrical energy to generate force to drive the vehicle). Motors M1 and M2 are both polyphase (in this embodiment, three phases) permanent magnet type synchronous motors. Motor M1 has phase coils each having one end connected to a neutral point. Motor M1 has the phase coils with their respective other ends connected respectively to intermediate points between switching elements of upper and lower arms 15-17 of phases of inverter 14A.

Note that motors M1 and M2 may have a function of an electric power generator driven by an engine, or may have a function of a motor and that of an electric power generator together. Furthermore, motors M1 and M2 operate as a motor for the engine, and may be adapted to be incorporated into a hybrid vehicle as what can start the engine, for example. That is, in the present embodiment, a "motor" includes an alternating-current motor, an alternating-current generator, and an alternating-current motor generator.

Inverters 14A and 14B have input sides, respectively, connected between positive electrode line 7 and negative electrode lines 5 to direct current voltage generating unit 10# in parallel. Inverters 14A and 14B have output sides, respectively, connected to motors M1 and M2, respectively. Note that inverters 14A and 14B are basically identical in structure, and accordingly, in the following description, inverter 14A will mainly be described and inverter 14B will not be repeatedly described in principle.

Inverter 14A is formed of upper and lower U phase arms 15, upper and lower V phase arms 16, and upper and lower W phase arms 17. The upper and lower phase arms are configured of switching elements Q3-Q8 connected in series between positive electrode line 7 and negative electrode line 5. Antiparallel diodes D3-D8 are connected for switching elements Q3-Q8, respectively. Motor M1 has phase coils with their respective other ends connected respectively to intermediate points between switching elements of upper and lower phase arms 15-17. Switching elements Q3-Q8 are switched on/off, as controlled by control signals S3A-S8A issued from controller 40.

Inverter 14A when a torque command value Trqcom1 for motor M1 is positive has switching elements Q3-Q8 switched in response to control signals S3A-S8A to convert direct current electric power supplied from direct current voltage generating unit 10# into alternating current electric power and supply it to motor M1. This drives motor M1 to generate torque corresponding to torque command value Trqcom1.

In contrast, when the electrically powered vehicle with motor drive control system 1 mounted therein is generatively braked, torque command value Trqcom1 for motor M1 is set to be negative. In that case, inverter 14A is switched in response to control signals S3A-S8A to convert alternating current voltage generated by motor M1 into direct current voltage and supply it to converter 12.

Current sensor 24 senses a current flowing through motor M1, and outputs the sensed motor current to controller 40. Note that three-phase currents iu, iv, iw have instantaneous values providing a sum of zero, and accordingly, disposing current sensor 24 to sense currents for two phases, as shown in FIG. 1, suffices.

A rotational angle sensor (or resolver) 25 senses a rotation angle θ1 of the rotor of motor M1, and sends the sensed rotation angle θ1 to controller 40. Controller 40 can use rotation angle θ1 to calculate a rotational speed of motor M1.

Inverter 14B is controlled based on control signals S3B-S8B issued from controller 40 in response to a torque command value Trqcom2 for motor M2. As has been described above, inverter 14B basically has the same structure as inverter 14A, and accordingly, will not be described repeatedly in detail.

Furthermore, motor drive control system 1 comprises insulating elements Z1-Z3 and a detector 30.

Insulating elements Z1-Z3 (hereinafter also collectively referred to as "insulating element Z") are resistive elements for insulating an electric conduction path between direct current power supply B and motors M1 and M2 (hereinafter also referred to as "a/the vehicular high voltage system") from outside the system. Insulating element Z1 has one end connected to a connection node between direct current power supply B and converter 12, and the other end connected to the vehicular body. Insulating element Z2 has one end connected to a connection node between inverter 14A and motor M1, and the other end connected to the vehicular body. Insulating element Z3 has one end connected to a connection node between inverter 14B and motor M2, and the other end connected to the vehicular body. Note that the insulating elements are not limited to the above in number and position.

Detector 30 is connected to insulating element Z via the vehicular high voltage system. Detector 30 detects that the vehicular high voltage system has insulation failure (or short circuit) by detecting that insulating element Z has a decreased impedance (or resistance value).

Detector 30 comprises a capacitor Cd, a resistive element Rd, an oscillatory power supply 31, a filter 32, and a determination device 33. Capacitor Cd, resistive element Rd, and oscillatory power supply 31 are connected in series between the vehicular high voltage system and the vehicular body.

Capacitor Cd has one end connected to the vehicular high voltage system (in FIG. 1, a connection node between the negative electrode of direct current power supply B and system relay SR2), and the other end connected to one end of resistive element Rd.

Oscillatory power supply 31 is connected between the other end of resistive element Rd and the vehicular body. Oscillatory power supply 31 outputs a pulsing potential signal oscillated at a predetermined frequency A (e.g., approximately 2.5 Hz) between a potential V0 (of 0 V for example) and a potential V1 (of 5 V for example).

Filter 32 passes only a potential of a connection node between capacitor Cd and resistive element Rd that is a potential of the band of frequency A, and outputs it to determination device 33. Note that hereinafter the potential that filter 32 outputs is also referred to as "output potential wave Vw."

Determination device 33 detects that the vehicular high voltage system has insulation failure, based on output potential wave Vw, when converter 12 stops, for example.

Figure 2:
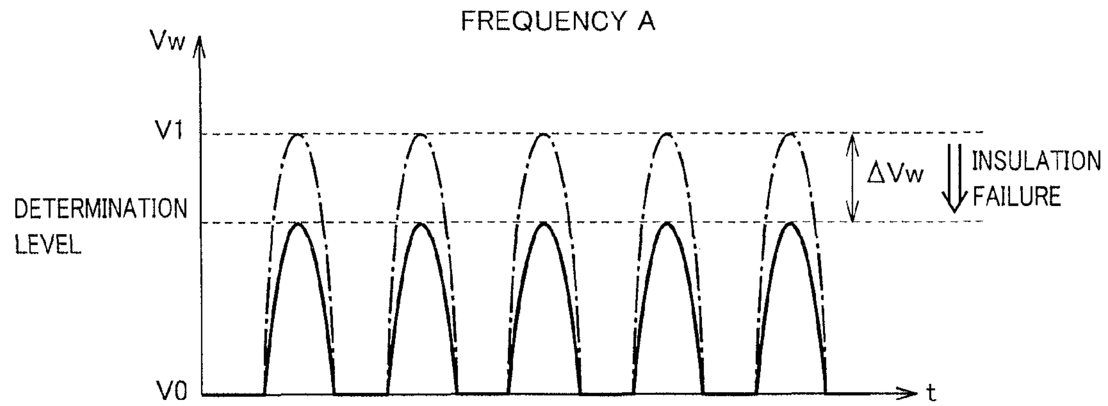
FIG. 2 is a waveform diagram of an output potential wave Vw.

FIG. 2 is a waveform diagram of output potential wave Vw. If insulating element Z has a normal value in impedance (for example of 2 MΩ), output potential wave Vw has a local maximum substantially equal in potential to maximum value V1 of the pulsing potential signal that oscillatory power supply 31 outputs, as indicated by an alternate long and short dash line. Output potential wave Vw has a local maximum decreasing as insulating element Z decreases in impedance. When insulating element Z is smaller in impedance than a predetermined value (for example of 150 kΩ), which means a condition having a possibility that insulation failure may arise in the vehicular high voltage system, output potential wave Vw has a local maximum decreased to be lower than a predetermined determination level, as indicated by a solid line.

In order to determine whether the vehicular high voltage system has insulation failure, determination device 33 detects a local maximum of output potential wave Vw for a predetermined period of time (for example of 3 seconds). Then, determination device 33 compares an average value of a plurality of local maximums of output potential wave Vw detected within the predetermined period of time with the determination level (a value corresponding to insulation failure) indicated in FIG. 2, and if the average value of the local maximums is lower than the determination level, determination device 33 determines that the vehicular high voltage system has insulation failure. Hereinafter, such determination process will also be referred to as an "insulation determination process". If determination device 33 is currently in the insulation determination process, determination device 33 outputs a flag F to controller 40 to indicate that the insulation determination process is currently performed.

If as a result of the insulation determination process determination device 33 determines that the vehicular high voltage system has insulation failure, determination device 33 outputs a ground fault signal L to controller 40.

Note that while the present embodiment provides detector 30 external to controller 40, detector 30 may entirely or partially be provided in controller 40.

Controller 40 is configured as an electronic control unit (ECU) having a central processing unit (CPU) and a memory (not shown) incorporated therein, and uses information and a program stored in the memory to perform a predetermined operation process to control an operation of converter 12 and those of inverters 14A and 14B.

More specifically, controller 40 generates control signals S1, S2 by PWM control for causing system voltage VH to coincide with a voltage command value, and outputs the control signals to converter 12.

Furthermore, controller 40 generates control signals S3A-S8A and S3B-S8B by PWM control for causing a torque of motor M1 and a torque of M2 to coincide with torque command values Trqcom1 and Trqcom2, respectively, and outputs the control signals to inverters 14A and 14B, respectively.

Figure 3:
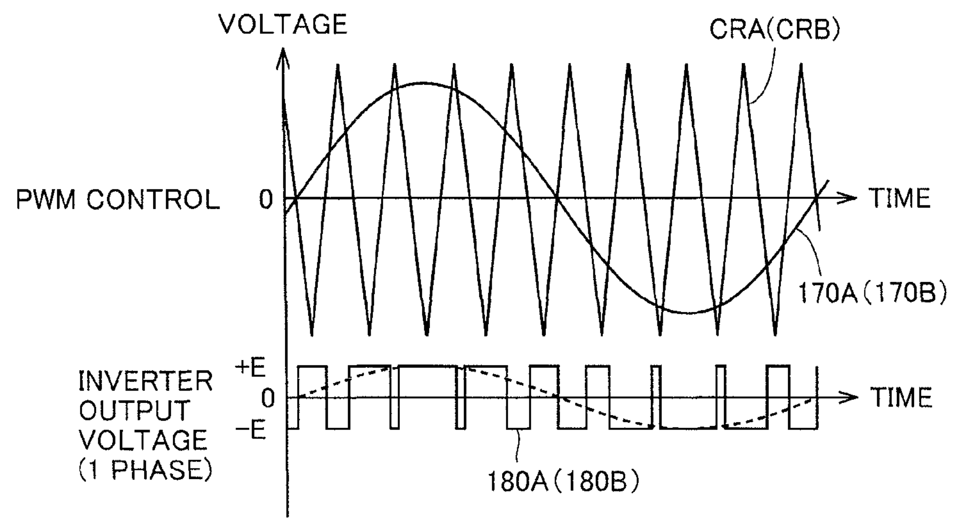
FIG. 3 is a waveform diagram of a carrier signal, a phase voltage command, and pulse width modulated voltage.

FIG. 3 is a waveform diagram of a carrier signal CRA, a phase voltage command 170A, and pulse width modulated voltage 180A used to PWM-control inverter 14A. As shown in FIG. 3, when inverter 14A is PWM-controlled, carrier signal CRA is compared with phase voltage command 170A in voltage, and inverter 14A has each phase's switching elements switched on/off as controlled in accordance therewith to apply pseudo-sine wave voltage as pulse width modulated voltage 180A to each phase of motor M1. Accordingly, how many times inverter 14A is switched per unit time (hereinafter also referred to as a "switching frequency") depends on the frequency of carrier signal CRA (hereinafter also referred to as a "carrier frequency fa").

Note that inverter 14B is PWM-controlled with a carrier signal CRB, a phase voltage command 170B, and pulse width modulated voltage 180B, which are similar in waveform to carrier signal CRA, phase voltage command 170A, and pulse width modulated voltage 180A. Accordingly, inverter 14B has a switching frequency depending on the frequency of carrier signal CRB (hereinafter also referred to as a "carrier frequency fb").

When inverters 14A and 14B are PWM-controlled and accordingly switched, the inverters cause noise and have loss (a switching loss). When carrier frequencies fa and fb are high, the noise is small, however, the loss is large. In contrast, when carrier frequencies fa and fb are low, the loss is small, however, the noise is large. While in view of energy efficiency it is desirable to set carrier frequencies fa and fb to have a small value providing a limited loss, doing so provides increased noise.

In view of such a problem, controller 40 sets for each of carrier frequencies fa and fb a range of a frequency corresponding to a state of an operation of motor M1 and to vary each of carrier frequencies fa and fb within a corresponding range independently and randomly to allow PWM control with loss reduction and noise reduction both established without impairing motors M1 and M2 in controllability. Note that, in the following description, varying carrier frequencies fa and fb randomly will also be referred to as "random control".

Figure 4:
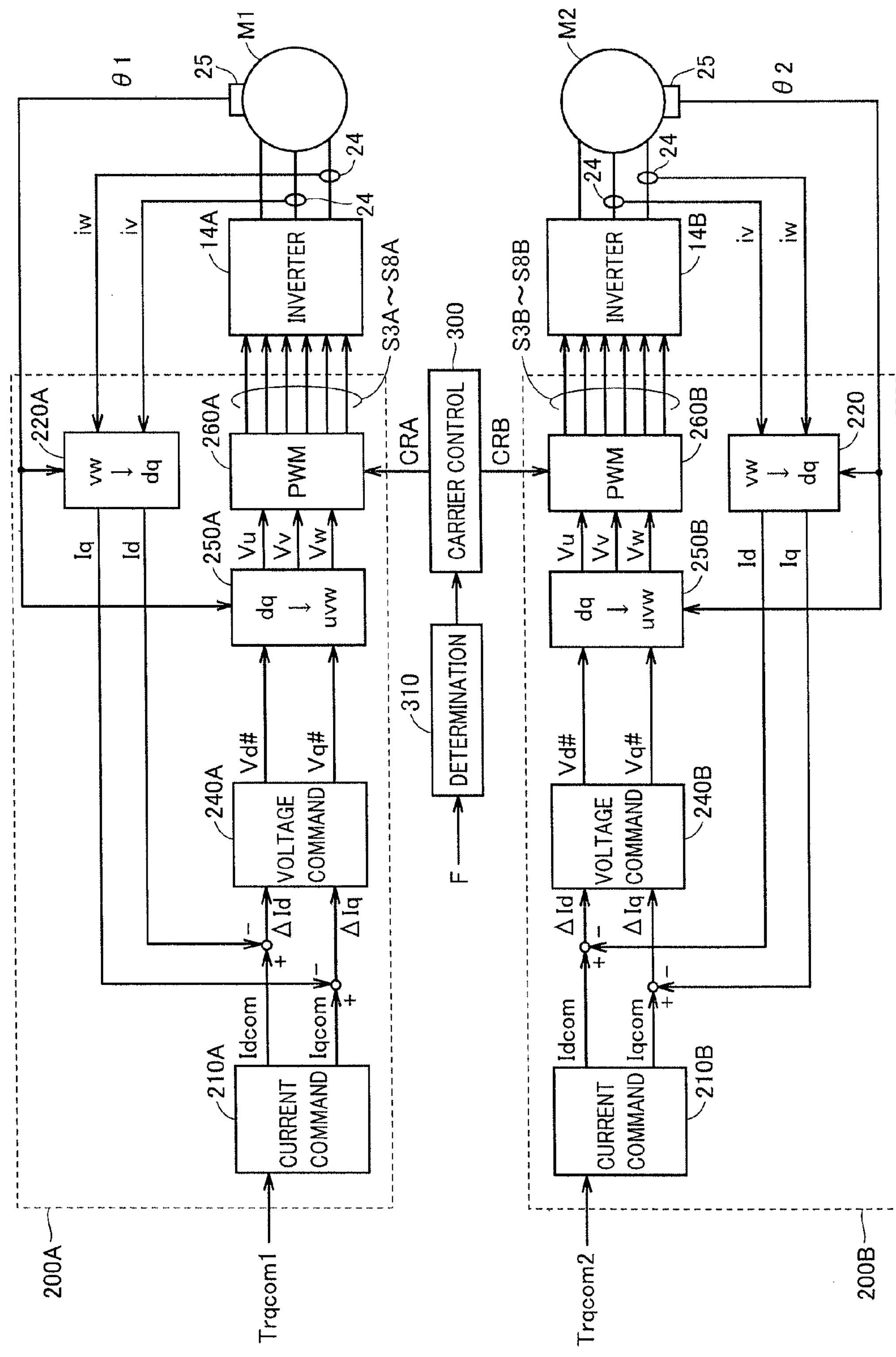
FIG. 4 is a functional block diagram of a controller.

FIG. 4 is a functional block diagram of controller 40 of a portion associated with PWM control. FIG. 4 shows functional blocks, which may be implemented by a hardware processing by electronic circuitry or the like, or may be implemented by a software processing by executing a program or the like.

Controller 40 includes PWM control units 200A and 200B, a carrier control unit 300, and a determination unit 310.

PWM control unit 200A includes a current command generation unit 210A, coordinate transformation units 220A and 250A, a voltage command generation unit 240A, and a PWM modulation unit 260A. PWM control unit 200B includes a current command generation unit 210B, coordinate transformation units 220B and 250B, a voltage command generation unit 240B, and a PWM modulation unit 260B. Each function of PWM control unit 200B is basically the same as that of PWM control unit 200A, and accordingly, hereinafter, PWM control unit 200A will mainly be described and PWM control unit 200B will not be specifically described in principle.

Current command generation unit 210A uses a previously prepared map or the like to apply torque command value Trqcom1 thereto to generate a d axis current command value Idcom and a q axis current command value Iqcom.

Coordinate transformation unit 220A performs coordinate transformation (three phases→two phases) using rotation angle θ1 of motor M1 sensed by rotational angle sensor 25 to calculate a d axis current Id and a q axis current Iq based on V phase current iv and W phase current iw sensed by current sensor 24.

Voltage command generation unit 240A receives a deviation ΔId of d axis current command value Idcom and d axis current Id (ΔId=Idreq−Id), and a deviation ΔIq of q axis current command value Iqcom and q axis current Iq (ΔIq=Iqreq−Iq).

Voltage command generation unit 240A performs a proportional-plus-integral (PI) operation for each of d axis current deviation ΔId and q axis current deviation ΔIq to obtain an error deviation, and in accordance therewith generates a d axis voltage command value Vd# and a q axis voltage command value Vq#.

Coordinate transformation unit 250A performs coordinate transformation (two phases→three phases) using rotation angle θ1 of motor M1 to convert d axis voltage command value Vd# and q axis voltage command value Vq# into U-, V-, and W-phase voltage commands Vu Vv, and Vw.

Determination unit 310 determines from flag F indicated by detector 30 whether the insulation determination process is currently performed, and determination unit 310 outputs a determination result to carrier control unit 300.

Carrier control unit 300 sets carrier frequencies fa and fb, generates carrier signals CRA and CRB according to the set carrier frequencies fa and fb, and outputs them to PWM modulation units 260A and 260B, respectively. In doing so, carrier control unit 300 follows the determination result (i.e., whether the insulation determination process is currently performed) provided by determination unit 310 to switch a method of setting carrier frequencies fa and fb. How carrier frequencies fa and fb are set will be described later in detail.

PWM modulation unit 260A generates control signals S3A-S8A for inverter 14A in accordance with a comparison in voltage between carrier signal CRA and U-, V-, and W-phase voltage commands Vu Vv, and Vw received from coordinate transformation unit 250A (equivalent to phase voltage command 170A of FIG. 2). Inverter 14A has its upper and lower phase arm elements turned on/off in response to control signals S3A-S8A to apply pseudo-sine wave voltage corresponding to pulse width modulated voltage 180A of FIG. 2 to each phase of motor M1.

Hereinafter will be described how carrier control unit 300 sets carrier frequencies fa and fb when the insulation determination process is performed and how carrier control unit 300 does so when the insulation determination process is not performed.

Initially, when the insulation determination process is not performed, carrier frequencies fa and fb are set, as described hereinafter.

When the insulation determination process is not performed, carrier control unit 300 sets carrier frequencies fa and fb by the above described random control.

Hereinafter, the random control will be described in detail. Initially, carrier control unit 300 calculates a reference frequency fas and a reference frequency fbs for carrier frequency fa and carrier frequency fb, respectively, based on torque T of motor M2 and rotational speed N of motor M2.

Figures 5, 6:
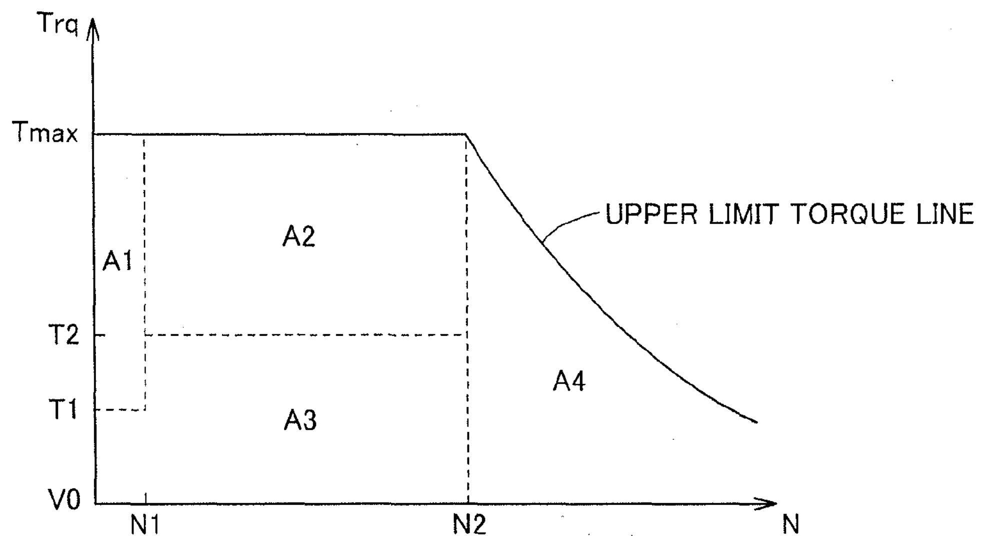
FIG. 5 is a map representing a relationship between a motor's torque T and rotational speed N and a range in which reference frequencies fas, fbs are switched.
FIG. 6 represents a relationship between regions A1-A4, reference frequencies fas, fbs, and carrier frequencies fa, fb.

FIG. 5 is a map showing a relationship between the motor M2 torque T and rotational speed N, and a reference frequency fas, fbs switching range. FIG. 5 represents rotational speeds N1, N2, torques T1, T2, Tmax, and an upper limit torque line, which are predetermined experimentally or the like. Note that the motor M2 torque T and rotational speed N provide an intersection (hereinafter also referred to as a "motor operation point"), which is controlled within a range which does not exceed the upper limit torque line.

Carrier control unit 300 switches the value of reference frequency fas and that of frequency fbs depending on which one of four regions A1-A4 shown in FIG. 5 includes the motor operation point. Note that regions A1-A4 are previously set in number and range experimentally in view of the controllability of motor M2 and avoiding overheating the motor and the like.

FIG. 6 represents a relationship between regions A1-A4 shown in FIG. 5, reference frequencies fas, fbs, and carrier frequencies fa, fb. When the motor operation point is included in region A1, A2, A3, A4, carrier control unit 300 sets reference frequency fas at predetermined value fas1, fas2, fas3, fas4, respectively. Similarly, when the motor operation point is included in region A1, A2, A3, A4, carrier control unit 300 sets reference frequency fbs at predetermined value fbs1, fbs2, fbs3, fbs4, respectively.

Note that predetermined values fs1-fs4 for regions A1-A4 are previously set in view of the controllability of motor M2 and avoiding overheating the motor and the like. In the present embodiment, reference frequencies fas and fbs vary in a large region from a low frequency region of approximately 0.75 kHz to a high frequency region of approximately 5 kHz.

Reference frequencies fas and fbs are previously set for any of regions A1-A4 such that reference frequencies fas and fab have a frequency difference Δfs larger than a predetermined value f1. Why setting frequency difference Δfs to have a larger value than predetermined value f1 has significance will be described later.

Then, carrier control unit 300 varies carrier frequencies fa and fb with reference to reference frequencies fas and fbs in ranges included in predetermined widths W1 and W2, respectively, randomly.

In the present embodiment, carrier control unit 300 varies carrier frequency fa randomly in a range in which a relational expression of $fas-(W1)/2<fa<fas+(W1)/2$ is established, and carrier control unit 300 also varies carrier frequency fb randomly in a range in which a relational expression of $fbs-(W2)/2<fb<fbs+(W2)/2$ is established, as shown in FIG. 6. Note that the carrier frequencies may be varied randomly by using a conventional technique. For example, a randomized map or a randomizing operation may be used.

Carrier frequencies fa and fb thus randomly varied with reference to reference frequencies fas and fbs allow a particular harmonic content to be reduced and thus inverters 14A and 14B to be less noisy. Accordingly, carrier frequencies fa and fb (reference frequencies fas and fbs) can also be set in a low frequency region with less switching loss.

The random control when the insulation determination process is not performed is thus exerted.

When the insulation determination process is performed, carrier frequencies fa and fb are set, as described hereinafter.

When the insulation determination process is performed, carrier control unit 300 restricts randomly controlled variation of carrier frequencies fa and fb to avoid reducing frequency difference Δf between carrier frequencies fa and fb to be smaller than predetermined value f1. Carrier frequencies fa and fb are prevented from having randomly controlled variation in the present embodiment, as follows: when the insulation determination process is performed, the random control is prohibited and carrier frequencies fa and fb are fixed at reference frequencies fas and fbs, respectively, as will be described hereinafter.

As has been described above, the insulation determination process is performed based on whether output potential wave Vw has a local maximum lower than a determination level (see FIG. 2). However, output potential wave Vw varies as a result not only of insulation failure but also of frequency difference Δf between carrier frequencies fa and fb (a difference between the switching frequency of inverter 14A and the switching frequency of inverter 14B).

Figure 7:
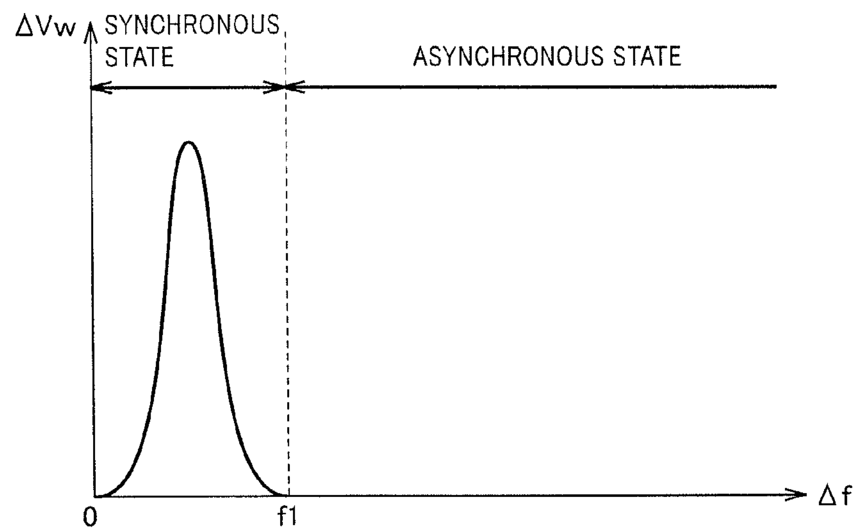
FIG. 7 represents a relationship between frequency difference $\Delta f$ between carrier frequencies fa, fb and a range $\Delta Vw$ in which a local maximum of output potential wave Vw varies.

FIG. 7 represents a relationship between frequency difference Δf of carrier frequencies fa and fb, and a range ΔVw in which a local maximum of output potential wave Vw varies. As shown in FIG. 7, when frequency difference Δf is larger than predetermined value f1 (hereinafter this state will be also referred to as an "asynchronous state"), variation range ΔVw is "0" and output potential wave Vw does not have a varying local maximum. In contrast, when frequency difference Δf is smaller than predetermined value f1 (hereinafter this state will be also referred to as a "synchronous state"), variation range ΔVw has a value large than "0" and output potential wave Vw has a varying local maximum. Accordingly, in the synchronous state, there is a possibility that while the vehicular high voltage system does not have insulation failure, output potential wave Vw has a local maximum dropped to be lower than the determination level, resulting in such a misdetection that the vehicular high voltage system has insulation failure.

To prevent such misdetection of insulation failure, carrier control unit 300, when the insulation determination process is performed, prohibits random control and fixes carrier frequencies fa and fb at reference frequencies fas and fbs, respectively.

Figure 8:
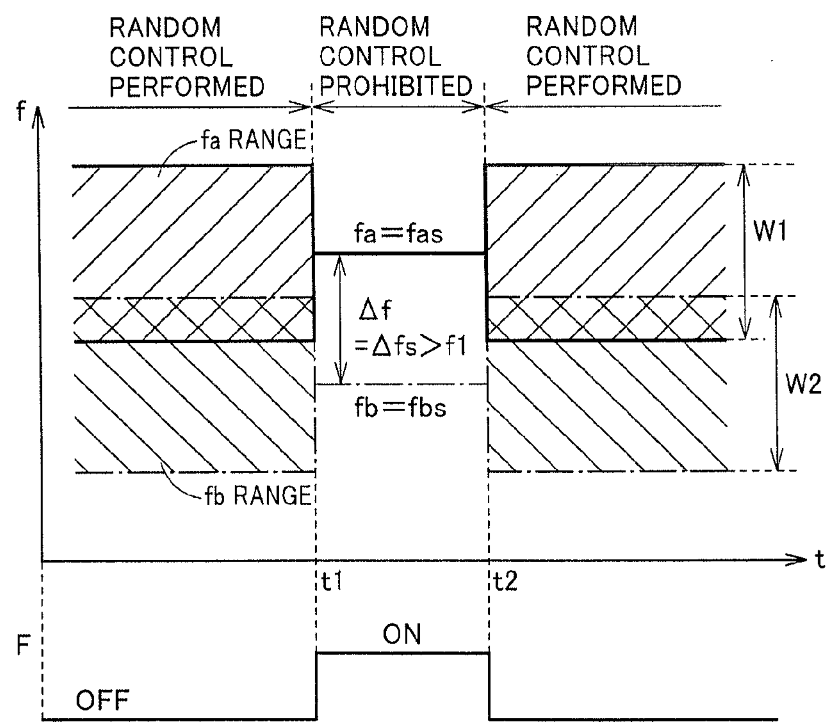
FIG. 8 represents how the carrier frequency fa variation range and the carrier frequency fb variation range vary with time.

FIG. 8 represents how the carrier frequency fa variation range and the carrier frequency fb variation range vary with time.

Before time t1 and after time t2, flag F is set off and the insulation determination process is not performed, and accordingly, the random control is performed. As a result, carrier frequency fa randomly varies in a predetermined width W1 with reference frequency fas as a center and carrier frequency fb randomly varies in a predetermined width W2 with reference frequency fbs as a center. This allows PWM control with loss reduction and noise reduction both established in an entire frequency region including a low frequency region.

From time t1 to time t2, flag F is set on and the insulation determination process is performed, and accordingly, the random control is prohibited and carrier frequencies fa and fb are fixed at reference frequencies fas and fbs, respectively. Accordingly, frequency difference Δf between carrier frequencies fa and fb will be frequency difference Δfs between reference frequencies fas and fbs. Frequency difference Δfs is previously set to have a value larger than predetermined value f1, as also shown in FIG. 6. This prevents the synchronous state described above (or prevents frequency difference Δf from being larger than predetermined value f1), and thus prevents frequency difference Δf from resulting in output potential wave Vw having a varying local maximum (see FIG. 7). This prevents such a misdetection that the vehicular high voltage system has insulation failure. Setting frequency difference Δfs between reference frequencies fas and fbs to have a value larger than predetermined value f1 has a significance in this regard.

Figure 9:
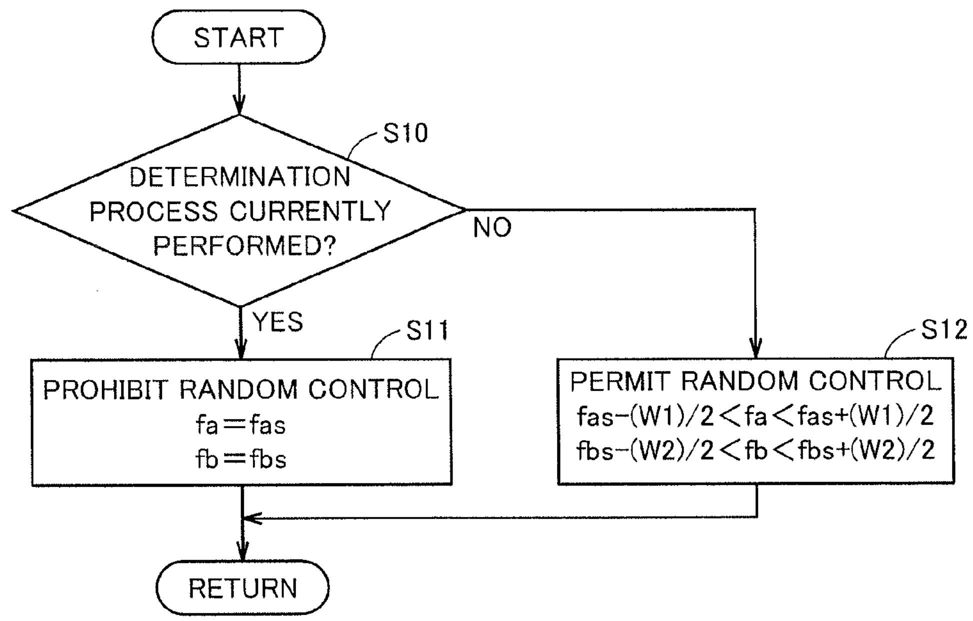
FIG. 9 is a flowchart (1) indicating a procedure of a process performed by the controller.

FIG. 9 is a flowchart (1) indicating a procedure of a process performed by controller 40 to implement the above described function. The below described flowchart's steps (hereinafter abbreviated as "S") may be implemented by hardware processing or software processing, as has been described above.

In S10, controller 40 determines from flag F whether the insulation determination process is currently performed.

If the insulation determination process is currently not performed (NO at S10), controller 40 proceeds to S12 to permit the random control. That is, controller 40 varies carrier frequency fa with reference to reference frequency fas randomly in a range included in predetermined width W1 and also varies carrier frequency fb with reference to reference frequency fbs randomly in a range included in predetermined width W2.

In contrast, when the insulation determination process is currently performed (YES at S10), controller 40 proceeds to S11 to prohibit the random control and fix carrier frequencies fa and fb at reference frequencies fas and fbs, respectively.

Thus in the present embodiment controller 40 when the insulation determination process is currently performed prohibits the random control and fixes carrier frequencies fa and fb at reference frequencies fas and fbs, respectively. This can prevent the synchronous state and hence prevent carrier frequencies fa and fb from having frequency difference Δf resulting in output potential wave Vw having a varying local maximum. This can prevent detector 30 from misdetecting that the vehicular high voltage system has insulation failure.

First Exemplary Variation

Figure 10:
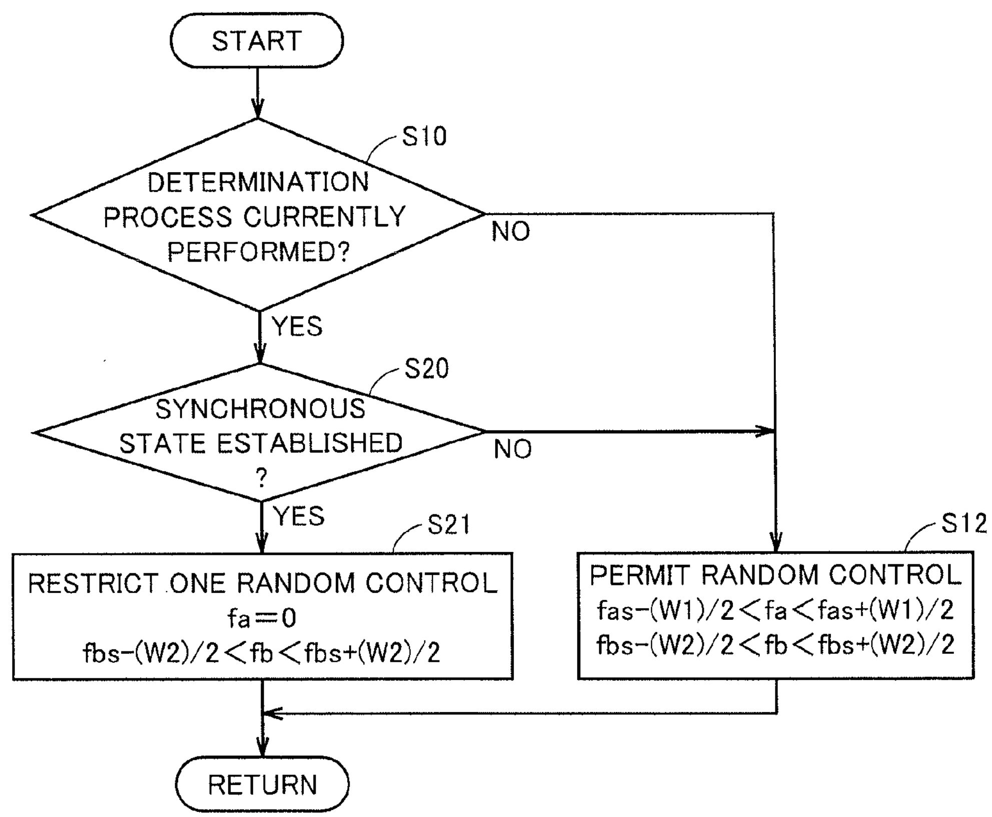
FIG. 10 is a flowchart (2) indicating a procedure of a process performed by the controller.

In the foregoing embodiment, in order to prevent misdetection of insulation failure, the random control is prohibited throughout the insulation determination process uniformly to fix carrier frequencies fa and fb, regardless of whether the synchronous state is established. This technique may be modified, as follows:

FIG. 10 is a flowchart indicating a procedure of a process performed by controller 40 according to a first exemplary variation. Note that the steps of the FIG. 10 flowchart that are identical to those of the FIG. 9 flowchart are identically denoted. Accordingly, such steps will not be described repeated in detail.

If the insulation determination process is currently not performed (NO at S10), controller 40 proceeds to S12 to permit the random control. That is, controller 40 varies carrier frequency fa with reference to reference frequency fas randomly in a range included in predetermined width W1 and also varies carrier frequency fb with reference to reference frequency fbs randomly in a range included in predetermined width W2.

In contrast, when the insulation determination process is currently performed (YES at S10), controller 40 proceeds to S11 to prohibit the random control and fix carrier frequencies fa and fb at reference frequencies fas and fbs, respectively.

If the insulation determination process is currently performed (YES at S10), controller 40 proceeds to S20 to estimate whether the synchronous state will be established if the random control is continued. Specifically, controller 40 determines whether carrier frequencies fa and fb randomly controlled and thus set have frequency difference Δf smaller than predetermined value f1.

If controller 40 does not estimate that the synchronous state will be established (NO at S20), then, controller 40 proceeds to S12 to continue to exert the random control while the insulation determination process is currently performed.

In contrast, if controller 40 estimates that the synchronous state will be established (YES at S20), controller 40 proceeds to S21 to restrict the random control for one of carrier frequencies fa and fb to at least prevent the synchronous state. For example, controller 40 randomly controls and thus varies carrier frequency fb, and prohibits randomly controlling carrier frequency fa and sets it at reference frequency fas.

Thus in the first exemplary variation controller 40 restricts the random control during the insulation determination process when controller 40 estimates that the synchronous state will be established if carrier frequencies fa and fb randomly controlled and thus set are used. If controller 40 does not estimate that the synchronous state will be established, then, controller 40 continues to exert the random control while the insulation determination process is currently performed. This allows the random control to be exerted more continuously than when the random control is uniformly prohibited while the insulation determination process is performed. This allows PWM control with further limited loss and noise while preventing misdetection of insulation failure.

Note that the FIG. 10 S21 may be performed to stop outputting one of carrier frequencies fa and fb.

Note that the FIG. 10 S21 may be performed to randomly vary one of carrier frequencies fa and fb and set the other carrier frequency to shift it by predetermined value f1 with reference to the randomly varied carrier frequency. This will interlock carrier frequencies fa and fb offset from each other by predetermined value f1 in varying the carrier frequencies. The carrier frequencies can no longer be varied independently. However, this can at least prevent a particular harmonic content and allows inverters 14A and 14B to be less noisy.

Second Exemplary Variation

The foregoing embodiment and the first exemplary variation provide random control to vary each of carrier frequencies fa and fb individually, and restrict the random control while the insulation determination process is performed.

In contrast, a second exemplary variation provides random control continuously to vary carrier frequencies fa and fb offset from each other by predetermined value f1 and thus interlocked, regardless of whether the insulation determination process is currently performed.

FIG. 11 represents by way of example a technique employed to set carrier frequencies fa and fb by controller 40 in the second exemplary variation. As shown in FIG. 11, in the second exemplary variation, controller 40 employs a technique similar to that of the foregoing embodiment to set reference frequency fbs and vary carrier frequency fb with reference to reference frequency fbs randomly in a range included in predetermined width W2.

Then, controller 40 sets randomly varied carrier frequency fb plus an offset value f0 corresponding to predetermined value f1 as carrier frequency fa.

Varying carrier frequencies fa and fb that are offset by a value corresponding to predetermined value f1 allows frequencies fa and fb to be both varied and can also prevent misdetection of insulation failure. This allows the insulation determination process to be also performed with carrier frequencies fa and fb both varied, and inverters 14A and 14B to be less lossy and less noisy.

It should be understood that the embodiment disclosed herein is illustrative and non-restrictive in any respect. The scope of the present invention is defined by the terms of the claims, rather than the description above, and is intended to include any modifications within the scope and meaning equivalent to the teams of the claims.

REFERENCE SIGNS LIST

1: motor drive control system; 5, 6: negative electrode line; 7: positive electrode line; 10: voltage sensor; 10#: direct current voltage generating unit; 11, 24: current sensor; 12: converter; 13: voltage sensor; 14A, 14B: inverter; 15, 16, 17: upper and lower arms; 20#: driving force generating unit; 25: rotational angle sensor; 30: detector; 31: oscillatory power supply; 32: filter; 33: determination device; 40: controller; 210A, 210B: current command generation unit; 220A, 250A, 220B, 250B: coordinate transformation unit; 240A, 240B: voltage command generation unit; 260A, 260B: modulation unit; 300: carrier control unit; 310: determination unit; B: direct current power supply; CN0, CN1: smoothing capacitor; Cd: capacitor; D1-D8: antiparallel diode; L1: reactor; M1, M2: motor; Q1-Q8: switching element; SR1, SR2: system relay; Rd: resistive element; Z1-Z3: insulating element

The invention claimed is:

1. A controller for a vehicle, said vehicle including:

a power supply;

a plurality of motors;

a plurality of inverters performing electric power conversion between said power supply and said plurality of motors;

an insulating resistor for externally, electrically insulating an electric conduction path connecting said power supply, said plurality of motors, and said plurality of inverters; and a detector connected to said insulating resistor via said electric conduction path and performing a determination process to determine whether said insulating resistor is defective, based on how a determination signal varies in potential, to detect whether said insulating resistor is defective, said determination signal varying in potential as said insulating resistor has a reduced resistance value, and also varying when said plurality of inverters have operating frequencies with a difference smaller than a predetermined value, the controller comprising:

a determination unit that determines whether said detector currently performs said determination process; and a control unit that controls said operating frequencies of said plurality of inverters in accordance with a result provided by said determination unit, when said determination process is currently not performed, said control unit performing random control to arbitrarily vary each of said operating frequencies of said plurality of inverters, when said determination process is currently performed, said control unit performing limitative control to restrict said random control to allow said plurality of inverters to have said operating frequencies with limited variation to prevent said operating frequencies from having a difference smaller than said predetermined value.

2. The controller for a vehicle according to claim 1, wherein said limitative control prohibits said random control and fixes said operating frequencies of said plurality of inverters to have a difference larger than said predetermined value.

3. The controller for a vehicle according to claim 1, wherein when a synchronous state in which said operating frequencies of said plurality of inverters that should be controlled by said random control have a difference smaller than said predetermined value, is not established, said limitative control maintains performing said random control, whereas when said synchronous state is established, said limitative control shifts said operating frequencies of said plurality of inverters to have a difference larger than said predetermined value.

4. The controller for a vehicle according to claim 1, wherein said limitative control varies any one of said operating frequencies of said plurality of inverters arbitrarily, and employs said one operating frequency that is arbitrarily varied as a reference to limitatively shift the other said operating frequency/frequencies from each other by a value corresponding to said predetermined value and thus varies said other operating frequency/frequencies.

5. The controller for a vehicle according to claim 1, wherein:

said plurality of inverters are operated as controlled based on a result of comparing a plurality of carrier signals corresponding to said plurality of inverters, respectively, with a plurality of control commands corresponding to said plurality of inverters, respectively; and said control unit controls said plurality of carrier signals to control said operating frequencies of said plurality of inverters.

* * * * *